United States Patent [19]

Davis

[11] Patent Number: 4,494,011

[45] Date of Patent: Jan. 15, 1985

[54] HIGH VOLTAGE NANOSECOND PULSE GENERATOR

[76] Inventor: Stephen J. Davis, 3576 La Mesa, Hayward, Calif. 94542

[21] Appl. No.: 358,021

[22] Filed: Mar. 15, 1982

[51] Int. Cl.³ .............................................. H03K 3/02
[52] U.S. Cl. ...................................... 307/106; 328/59
[58] Field of Search ...................... 323/292; 307/106; 328/59, 61

[56] References Cited

U.S. PATENT DOCUMENTS 4,158,803  6/1979  Berger ................................ 323/292

OTHER PUBLICATIONS

Inst. & Exp. Techniques, (Trans. of: Prib. & Tekh. Eksp. (USSR)), vol. 17, No. 4, pt. 1, pp. 1035, 1036, Jul.-Aug. 1974, DIN S5703 0227M.

Atmospherics-Optics Institute, Siberian Branch, Academy of Sciences of the USSR, Tomsk. Translated from Pribory i Tekhinka Eksperimenta, No. 3, pp. 107-108, May-Jun. 1973.

Primary Examiner—William H. Beha, Jr.

[57] ABSTRACT

A high voltage pulse generator for generating at least 500 kilowatts power over a time interval of substantially two nanoseconds with short risetime, using a high voltage avalanche source, a plurality of biased triode amplifier tubes and circuits and a voltage step-down transformer between any two consecutive tube stages.

5 Claims, 6 Drawing Figures

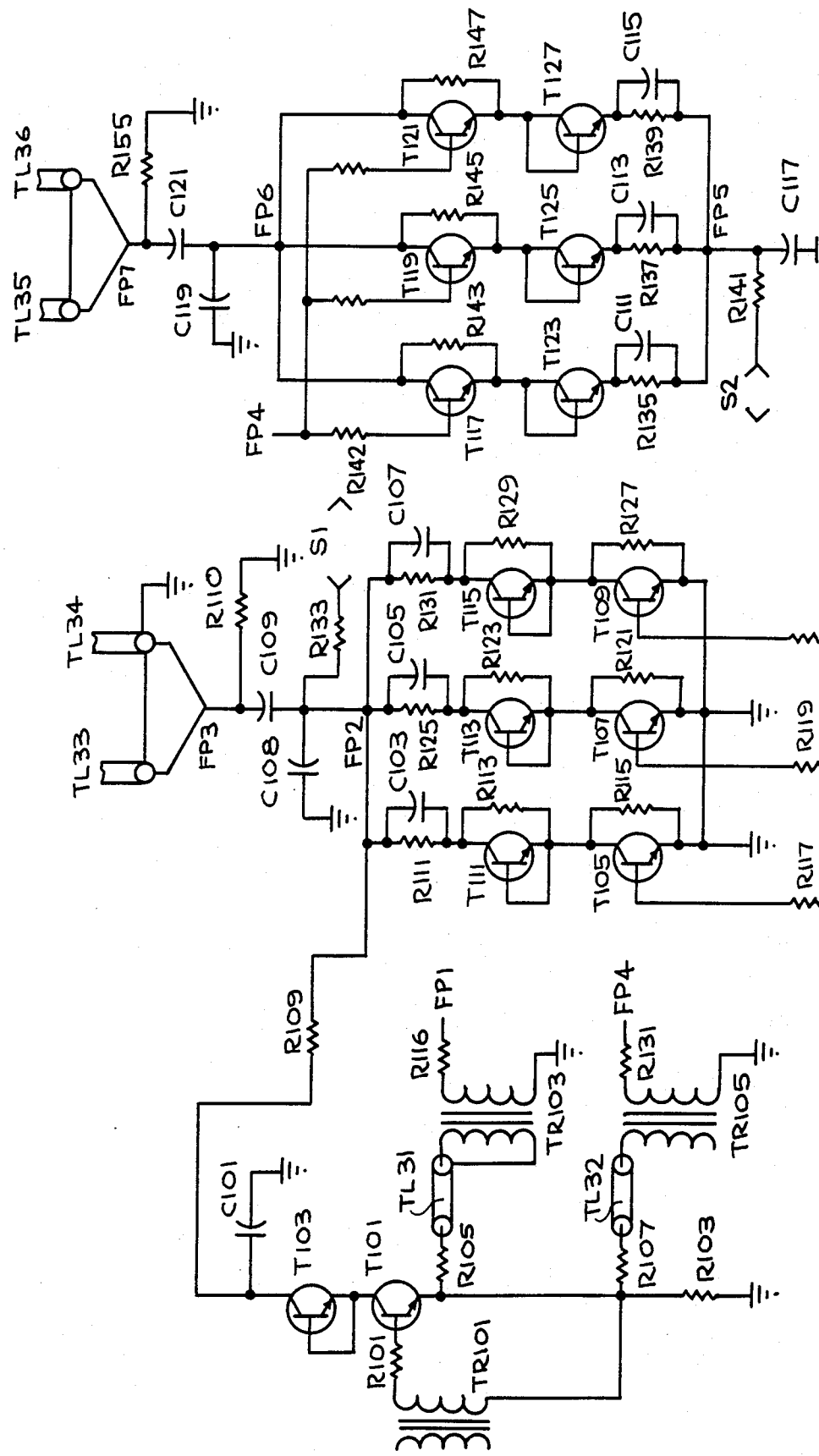

HIGH VOLTAGE NANOSECOND PULSE GENERATOR

BACKGROUND OF THE INVENTION

Pulse power requirements, for driving electrical apparatus used in magnetic fusion, laser fusion and similar processes, have grown substantially over the past ten years, with the result that pulse power availability is now a major limitation on technological progress in such applications.

FIELD OF THE INVENTION

The invention relates to broadband pulsed power apparatus for providing multi-megawatt power of time intervals of the order of a few nanoseconds.

One apparatus for switching a high voltage power supply, disclosed in U.S. Pat. No. 4,158,803 issued to Berger, uses two high voltage and frequency planar triodes as source and sink, respectively, for the current to a highly capacitive load. The source tube conducts only when the sink tube is non-conducting. With an input pulse applied to the source tube through a source error amplifier and shunt comparator that is also connected to the sink tube, the sink tube is caused by the comparator to conduct, thus switching the source tube to a non-conducting state, whenever the pulse amplitude exceeds a pre-determined dc reference carried by the comparator. The source and sink tube rapidly charge and discharge, respectively, the output capacitance. The overall circuit appears to be tuned, and the source and sink tubes appear to be operated in the conventional regime, with voltage risetimes of the order of microseconds; but no circuit parameters of tube characteristics are specified in the patent disclosure or claim.

SUMMARY OF THE INVENTION

One object of the invention is to provide apparatus for generating pulse power of $\approx 2$ megawatts over time intervals of the order of 2 nanoseconds, with associated risetimes of the order of 200 picoseconds or less.

Another object is to provide broadband pulse power apparatus with a dynamic frequency range of the order of 1000:1.

A third object is to provide apparatus to obtain peak pulse power of the order of $\gtrsim 170$ kilowatts from a conventional triode with nominal cathode area ($\approx 2$ cm$^2$).

A fourth object is to provide a means of concatenating additional stages of the tubes and associated circuitry, without additional engineering being required, to provide even higher power output over substantially the same time intervals.

Other objects of the invention, the advantages thereof, will become clear by reference to the detailed description and the accompanying drawings.

To achieve the foregoing objects, the invention in one embodiment may comprise a high voltage avalanche source to provide up to 2 kilowatts power; a first biased, grid-grounded triode amplifier tube circuit with cathode coupled across a first capacitor to the output of the high voltage avalanche; a first voltage step-down transformer that is coupled across a second capacitor to the anode of the first triode tube circuit; a second biased, grid-grounded triode amplifier tube circuit with cathode coupled to the output of the first voltage step-down transformer; with the anode of the second triode tube being coupled across a third capacitor to three, substantially identical circuits in parallel, each circuit comprising a voltage step-down transformer that is coupled to the cathode of a biased, grid-grounded triode amplifier tube; with these latter three circuits being coupled across a common capacitor to the output point.

BRIEF DESCRIPTION OF THE DRAWINGS

FIGS. 3A, 3B and 3C exhibit three components of an alternative embodiment of the high voltage avalanche source of FIG. 2, with a trigger circuit replacing the transistor transformer front end combination shown in FIG. 1.

DETAILED DESCRIPTION

Figure 1A:
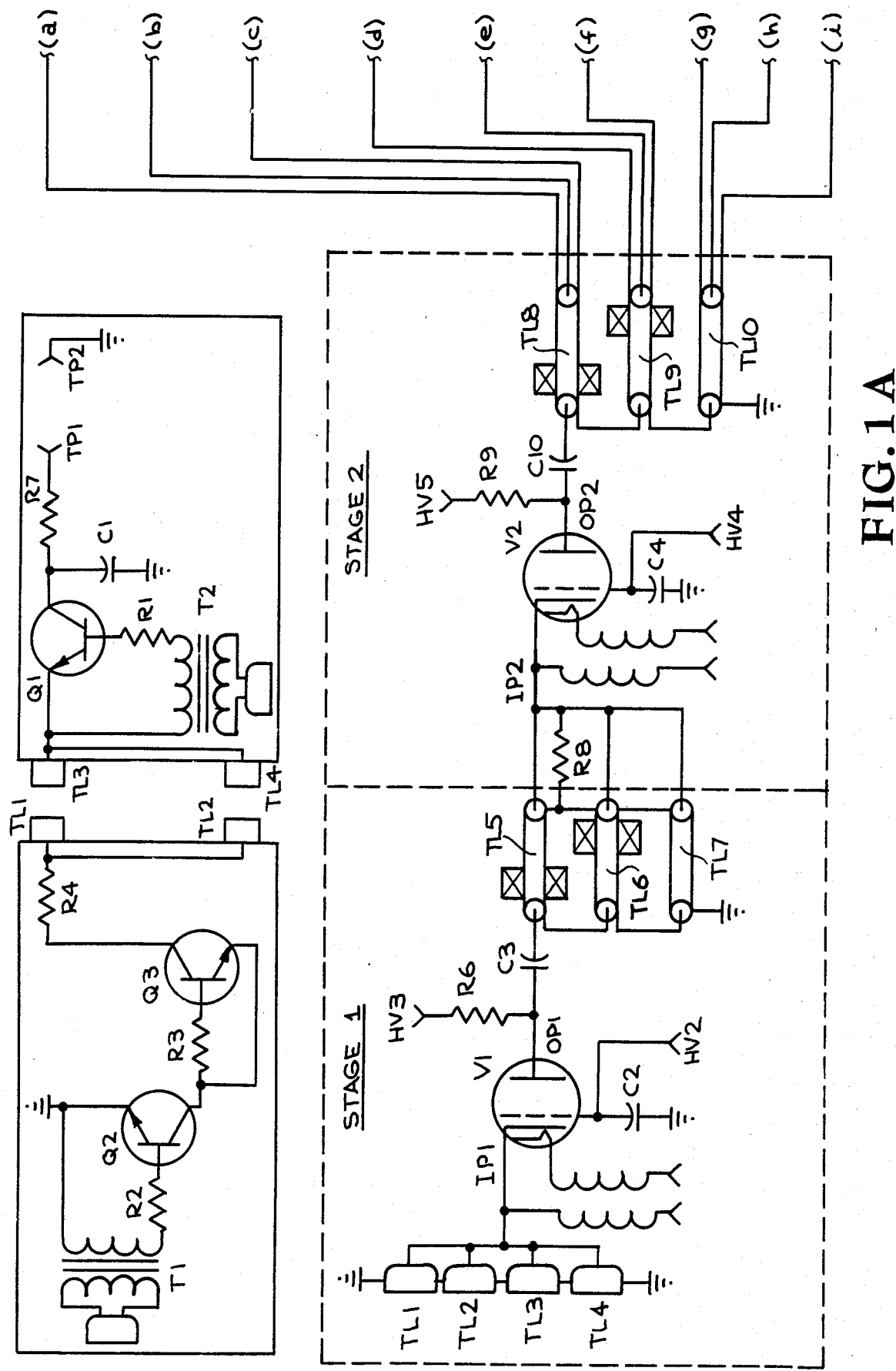
FIGS. 1A and 1B are a schematic view of a preferred embodiment of the invention.

The subject invention is a planar triode amplifier that operates in three (or more) stages, in one embodiment, to provide 500 kilowatts (KW) power over $\lesssim 1$ nanosecond (nsec.) or 2 megawatts (MW) power over $\lesssim 2$ nsec. The adjacent stages are coupled through broadband transmission line transformers that permit multiple stage operation with a tube (or tubes) that is (are) part of a single stage. Microwave planar triodes (in three or more stages) are part of broadband circuits, each including several 50 ohm transmission lines in parallel, connected to the cathode of each tube in the corresponding stage; the tube anode(s) is (are) connected to a 150 ohm load formed by the primary of a transmission line transformer. One feature of the invention is that the input and the output elements (coupling to adjacent stages) are sufficiently broadband that dynamic frequency ranges of 1000:1 or greater are available. No tuned circuit elements are used in the signal path(s) throughout the network.

The microwave triode grids are all grounded, which elminates the deleterious Miller effect (frequency-dependent grid-cathode capacitance multiplication) and enhances gain linearity across a broad frequency range, a second feature of the invention. This configuration (grid-grounded, cathode-driven) is possible because of the low impedance transformer characteristics achieved with the inter-stage transmission lines used.

A third feature, present because of the incorporation of the first two features, is that one can obtain peak pulse power greater than 170 KW (as compared to 10 KW by conventional operation) from a single 2 cm$^2$ cathode area at 12 KV anode voltage; and the pulse risetime to full power is less than one nanosecond. Using the techniques incorporated above, risetimes of 200 picoseconds or less are possible, although the present amplifier output risetime is limited by the input risetime available. Operation in this mode ($\Delta t_{risetime} \lesssim 1$ nsec.) requires the triode(s) to operate in a wholly different regime than the conventional regime ($\Delta t_{risetime} \approx 1$ $\mu$sec.) where the tube is operated in a resonant cavity. As a result, the tube amplification factor is reduced from 200:1 (conventional) to $\approx 5:1$ here.

The preferred embodiment uses three stages to achieve, say, 0.5 MW power by use of 5 KV through 50 ohms. As a fourth feature of the invention higher power levels are achievable by simply adding additional stages incorporating the first two features described above.

Grounding of the tube grids requires that all current for the cathode drive at any stage, plus the associated grid losses ($\approx$20-25%) at that stage, be supplied by the prior stage. At the last stage (third stage here) approximately 120 amps are available with the subject invention. A fifth feature of the subject invention allows impedance matching of the anode of stage n ($\geq$1) with the cathode impedance of the stage n+1 so that stages can be concatenated without further engineering or scaleup difficulties. The embodiment shown and described here has three stages, producing up to 120 amps; but additional (or fewer) stages may be added without changing the design philosophy.

A sixth feature is that the low impedance (Z) into the cathode allows a low associated time constant $\tau$ for cathode charge-up for repeat pulses for a given grid cathode capacitance C; alternatively, this allows operation with higher C for a given $\tau$. A seventh feature is that the use of an n:1 voltage step-down transformer as input to any stage allows an n:1 power increase to that stage.

Figure 1B:
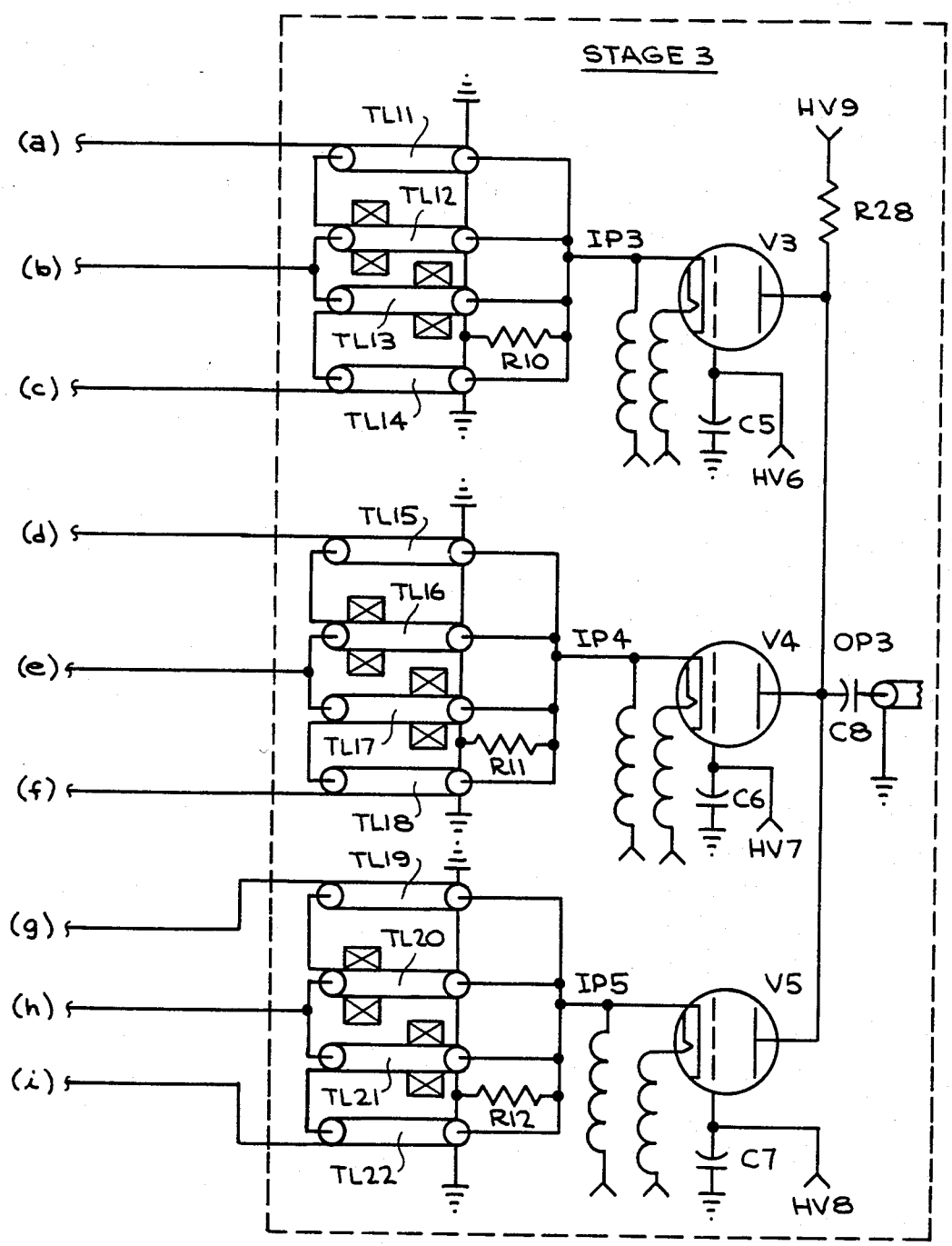

With reference to FIG. 1, the "input" to the apparatus is through two transformers T1 and T2 and corresponding resistors R1 and R2 ($\approx$50 ohms each) and base inputs to two npn transistors Q1 and Q2. The emitter of Q2 is grounded, and its collector is coupled to the base of a third npn transistor Q3 to form an avalanche stack. The collector of Q3 is resistively coupled (through R4$\approx$20 ohms) through two 50 ohm parallel transmission lines TL1 and TL2; and the emitter of Q1 is coupled through two more 50 ohm transmission lines TL3 and TL4, all through a common input feed point IP1 to the cathode of a triode tube V1, preferably the Varian Eimac 8940/Y-690 tube. All lines TL1-4 are broadband; and the voltage at IP1 is arranged to be substantially 300 volts (input on) and −80 volts (input off). With input power at 1.8 KW inputs at IP1 are directly connected to the cathode of the triode V1 and produce $\approx$7.5 KW output power at anode output point OP1.

A high voltage source ($\approx$400 volts) HV1 is coupled across a resistor R7 ($\approx$10$^5$ ohms), which is in turn grounded through a 10 nanofarad capacitor C1, to the collector of transistor Q1 with a corresponding drain time $\Delta t\approx$0.1 msec. The grid of the triode V1 has a −80 V bias applied from source HV2, and the grid is in turn grounded through a capacitor C2 ($\approx$2 nf). Because of the high capacitance chosen for C2, the tube V1 is effectively grid-grounded in the rf regime. At the anode output point OP1 of tube V1, an 8 KV bias is applied from a source HV3 across a resistor R6 ($\approx$10$^3$ ohms).

The signal at OP1 is capacitively coupled across C3 ($\approx$11 nf) to three parallel 50 ohm transmission lines TL5, TL6 and TL7 that together produce 16.67 ohms impedance to match the input (cathode) impedance of another grid-grounded triode V2 (preferably, also 8940/Y-690) terminated by a resistor R8 ($\approx$50 ohms). Little or no power is lost in transmission of the signal from output point OP1 to the input point IP2 to the cathode of triode V2 so that the power input at IP2 is substantially 7.5 KW. The output power at the anode output point OP2 of V2 is increased to about 70 KW; and the output signal is capacitively coupled through C10 ($\approx$11 nf) to three 50 ohm transmission lines TL8, TL9 and TL10 in parallel. Again, a voltage bias source HV4 ($\approx$−80 V) is coupled to the grid of V2. The grid of V2 is grounded through a capacitor C4 ($\approx$2 nf) so that this tube is also effectively grid-grounded in the rf regime. At the anode output point OP2 of tube V1, an 8 KV bias is applied from a source HV5 across a resistor R9 ($\approx$10$^3$ ohms).

Each of the transmission lines TL8, TL9 and TL10 is in turn coupled to four 50 ohm transmission lines TL11, TL12, TL13 . . . , TL22 in parallel as shown. The separate combinations of four transmission lines (e.g. TL11, TL12, TL13 and TL14) produce an input impedance of 12.5 ohms at the input point IP3 terminated by R10 ($\approx$50 ohms) of a triode tube V3 with, for example, the signal that passes through transmission line TL8 and TL11 then passing directly to the cathode input point IP3 of another grid-grounded triode V3 (preferably 8940/Y-690) with a grid that is grounded through a capacitor C5 ($\approx$2 nf). Similarly, the transmission lines TL9, TL15, TL16, TL17, TL18 (TL10, TL19, TL20, TL21, TL22) communicate directly with the cathode input point IP4 (IP5) terminated by R11 (R12) of the grid-grounded triode V4 (V5). Finally, the anodes of the three triodes V3, V4 and V5 communicate with a common output point OP3 that couples to the output of the amplifier through a capacitor C8 ($\approx$50 nf). The grids of the tubes V3, V4 and V5 are coupled directly to voltage bias source HV6, HV7 and HV8, respectively, (each −80 V); and the common anode point OP3 of the three tubes is coupled to a voltage bias source HV9 ($\approx$8 KV) across a resistor R28 ($\approx$1 K). The shields of all transmission lines TL1, TL2, . . . , TL22 are grounded.

Figure 2:
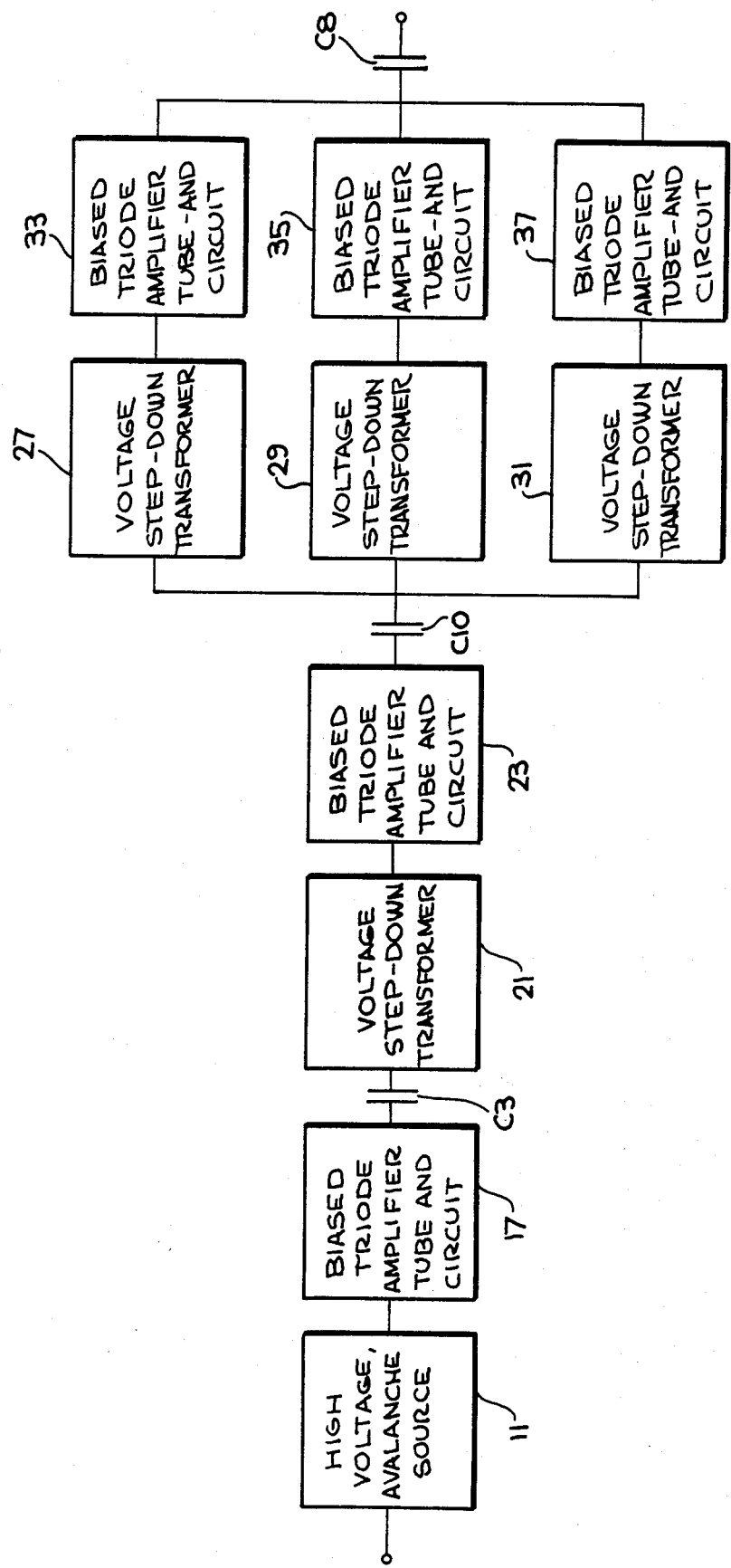
FIG. 2 is a functional representation of the embodiment of FIG. 1.

The embodiment of FIG. 1 can be represented generically as in FIG. 2. One begins with a high voltage avalanche source 11 that is coupled to a biased, grid-grounded triode amplifier tube and circuit 17. The output of this last circuit is capacitively coupled across C3 to a voltage step-down transformer 21 and is then fed to a second biased, grid-grounded triode amplifier tube and circuit 23. The output of the circuit 23 is capacitively coupled across C10 to three substantially identical, parallel voltage step-down transformers 27, 29 and 31 that each coupled directly and independently, to a separate biased, grid-grounded triode amplifier tube and circuit 33, 35 and 37, with these three tubes and circuits being substantially identical and with the anodes of these tubes being connected across a common capacitor C8 to the output point of the apparatus.

As an alternative to the high voltage avalanche source 11 (FIG. 2) shown in FIG. 1, at the front end, one may use a trigger circuit as shown in FIG. 3A (pulse input), FIG. 3B (turn-on circuit) and 3C (turn-off circuit). This embodiment allows the user to input an arbitrary trigger signal, for example, 5 volts into 50 ohms; and the embodiment of FIGS. 3 will produce the appropriate inputs to drive the cathode of the first tube V1.

The user enters an arbitrary trigger signal (within prescribed limits) through a 3:1 transformer TR101 (FIG. 3A) and across a resistance R101 ($\approx$50 ohms) to the base of npn transistor T101 whose collector is connected to the emitter of a second npn transistor T103. The collector of the second transistor is coupled to ground across a capacitor C101, which may have a value substantially 200 picofarads, and the base and emitter of this transistor are tied together. The emitter of the transistor T101 is coupled to ground across a resistor R103 and is further coupled to a first transmission line TL31 across a resistor R105 and to a second transmission line TL32 across another resistor R107, with both resistors having substantially equal resistance values $\approx$47 ohms.

The other end of transmission line TL31 (FIGS. 3A and 3B) is coupled across a second 3:1 transformer TR103 and across a resistor R116 ($\approx$50 ohms) to a first feed point FP1 that is in turn connected to the bases of three npn transistors T105, T107 and T109 whose emitters are all grounded (FIG. 3B). The collectors of the respective transistors T105, T107 and T109 are electrically connected to the base and emitter of three more npn transistors T111, T113 and T115, respectively. The collector and emitter of each of transistors T105, T107, T109, T111, T113 and T115 are connected, respectively, across resistors R115, R121, R127, R113, R123 and R129, each having a resistance of $\approx 10$ ohms. The base and emitter of each of transistors T111, T113 and T115 are tied together. The collecter of transistor T111 is coupled to a second feed point FP2 across a resistor R111 ($\approx 75$ ohms) and a capacitor C103 ($\approx 100$ picofarads) in parallel. Similarly, the collector of transistor T113 (respectively, T115) is coupled to feed point FP2 across a resistor R125 (respectively, R131) ($\approx 75$ ohms) and a capacitor C105 (respectively, C107) ($\approx 100$ picofarads) in parallel. Feed point FP2 is coupled across a resistor R133 ($\approx 50$ kilohms) to an 800 volt source S1, is coupled to ground across a capacitor C108 ($\approx 60$ picofarads), and is coupled across a capacitor C109 ($\approx 15$ nanofarads) to a third feed point FP3 that feeds two shield-grounded, 50 ohm transmission lines TL33 and TL34 that serve the same purposes as the transmission lines TL1 and TL2 of FIG. 1. The third feed point is coupled to ground across a resistor R110 ($\approx 1$ kilohm). The turn-on circuit and high voltage source of FIG. 3B is arranged to provide a leakage current to ground of $\approx 300$ μamps to provide faster pulse response. The second feedpoint FP2 is also resistively connected across R109 ($\approx 10^5$ ohms) to the collector of transistor T103.

The other end of transmission line TL32 (FIGS. 3A and 3C) is coupled across a third 3:1 transformer TR105 and across a resistor R131 ($\approx 50$ ohms) to a fourth feed point FP4 that is in turn connected to the bases of three npn transistors T117, T119 and T121 whose emitters are electrically connected to both the base and collector of three more npn transistors R123, T125 and T127, respectively (FIG. 3C). The emitter of transistor T123 is coupled to fifth feed point FP5 across a resistor R135 ($\approx 75$ ohms) and a capacitor C111 ($\approx 100$ picofarads) in parallel. Similarly, the collector of transistor T125 (respectively, T127) is coupled to feed point FP5 across a resistor R137 (respectively, R139) ($\approx 75$ ohms) and a capacitor C113 (respectively, C115) ($\approx 100$ picofarads) in parallel. The feed point FP5 is coupled to ground across a capacitor C117 ($\approx 15$ picofarads) and is coupled to an 800 volt source S2 across a resistor R141 ($\approx 50$ kilohms). The emitters of transistors T117, T119 and T121 are coupled across resistors R143, R145 and R147 (each $\approx 10$ ohms), respectively, to the collectors of these respective transistors. Finally, the collectors of transistors T117, T119 and T121 are connected to a sixth feed point FP6, which is connected to ground across a capacitor C119 ($\approx 60$ picofarads) and is connected across a capacitor C121 ($\approx 15$ nf) to a seventh feed point FR7 that feeds two transmission lines TL35 and TL36 that serve the same purposes as the transmission lines TL3 and TL4 in FIG. 1. Feed point FP7 is coupled to ground across a resistor R155 ($\approx 1$ kilohm). The turn-off circuit and high voltage source of FIG. 3C is arranged to provide a leakage current to ground of $\approx 300$ μamps to provide faster pulse response.

Each of the "vertical" circuits T105/T111, T107/T113, T109/T115, T123/T117, T125/T119, T127/T121 provides a boost in power for the corresponding turn-on or turn-off circuit; and the use of three such "vertical" circuits in parallel in each of the turn-on and turn-off circuits provides the required current.

Although the preferred embodiments of the invention have been shown and described herein, variation and modification may be made without departing from what is regarded as the scope of the invention.

I claim:
1. Apparatus for generating pulse power of at least one half megawatt over a time interval of substantially two nanoseconds with short risetime, the apparatus comprising:
   a high voltage avalanche source to provide up to two kilowatts power over a time interval of no more than one nanosecond in response to an input pulse for the apparatus;
   a first triode amplifier tube and circuit, with tube cathode electrically connected to the avalanche source output, with tube grid being grounded across a low capacitance capacitor and being further coupled to a first negative voltage source of at least 80 volts, and with tube anode being resistively connected to a voltage source of at least 8 kilovolts;
   a first broadband voltage step-down transformer allowing a step-down of substantially 3:1, connected at its input end across an anode capacitor to the anode of the first triode tube;
   a second triode amplifier tube and circuit, with tube cathode connected to the output of the first voltage step-down transformer, with tube grid being grounded across a second low capacitance capacitor and being further coupled to a second negative voltage source of at least 80 volts, and with the tube anode being resistively connected to a voltage source of at least 8 kilovolts;
   second, third and fourth, substantially identical broadband voltage step-down transformers, arranged in parallel with each such transformer being connected to its input end across a common second anode capacitor to the anode of the second triode tube;
   third, fourth and fifth, substantially identical triode amplifier tube and circuits, with tube cathodes being connected, respectively, to the outputs of the second, third and fourth voltage step-down transformers, with the third, fourth and fifth tube grids being grounded across third, fourth and fifth low capacitance capacitors, respectively, with the third, fourth and fifth tube grids being coupled to third, fourth and fifth sources of negative voltages, respectively, of voltage each substantially 80 volts, and with the anodes of the third, fourth and fifth triode tubes being resistively connected to a common voltage source of at least 8 kilovolts; and
   with the anodes of the third, fourth and fifth triode tubes being coupled across a common third capacitor to the output point of the apparatus.
2. Apparatus according to claim 1, wherein said high voltage avalanche source comprises:
   a source of voltage of at least 400 volts;
   a first npn transistor with its collector resistively connected to the voltage source and being grounded across a first capacitor;
   a first voltage step-down transformer, arranged to accept an input pulse, with one output end resistively connected to the base of the first transistor;
   first and second, substantially identical transmission lines, arranged in parallel and having associated resistance of substantially 50 ohms each, both lines being connected to the emitter of the first transistor at one end and to the first voltage step-down transformer, at the transformer's second output end;

a second voltage step-down transformer, arranged to accept a second input pulse, with one output end grounded;

a second npn transistor with grounded emitter and with its base resistively connected to the second output end of the second transformer;

a third npn transistor, with its base resistively coupled to its emitter and with its emitter connected to the collector of the second transistor;

third and fourth, substantially identical transmission lines, arranged in parallel and having associated resistances of substantially 50 ohms each, both lines being resistively connected to the collector of the third transistor at one end; and the second ends of each of the first, second, third and fourth transmission lines being connected to said cathode of said first triode amplifier tube.

3. Apparatus according to claim 1, wherein said high voltage avalanche source comprises:

a first transformer to receive an input pulse for the apparatus;

a first npn transistor, with its base resistively connected to one output end of the first transformer and with its emitter connected to the second output end of the first transformer and resistively connected to ground;

a second npn transistor with its base and emitter connected to the collector of the first transistor and with its collector capacitively connected to ground;

first and second, substantially identical transmission lines of resistance substantially 50 ohms each, resistively connected at one end of each to the emitter of the first transistor;

the second end of the first transmission line being connected to the input of a second transformer, with one output end of this transformer being grounded;

third, fourth and fifth, substantially identical npn transistors the base of each transistor, being connected across a separate, substantially identical resistor to the second output end of the second transformer, with the emitters of each of these transistors being grounded and with the emitter and collector of each of these transistors being resistively connected;

sixth, seventh and eighth, substantially identical npn transistors with the base and emitter of each of these transistors being connected, respectively, to the collector of the third, fourth and fifth transistors and the collectors of the sixth, seventh and eighth transistors being resistively connected, respectively, to the emitters of the sixth, seventh and eighth transistors;

first, second and third, substantially identical circuits, each comprising a resistor and a capacitor in parallel, connected at one circuit end, respectively, to the collectors of the sixth, seventh and eighth transistors, respectively, with the other end of each circuit being connected to a first common input point that is capacitively connected to ground and is resistively connected to a voltage source of at least 800 volts;

third and fourth, substantially identical transmission lines having associated resistances of substantially 50 ohms each, the shield of each of these two transmission lines being resistively connected to ground and one end of each transmission line being capacitively connected to the first common input point and being resistively connected to ground;

the second end of the second transmission line being connected to the input of a third transformer, with one output end of this transformer being grounded;

ninth, tenth and eleventh, substantially identical npn transistors, the base of each transistor being connected across a separate, substantially identical resistor to the second output end of the third transformer, with the collectors of each of these transistors being connected to a second common input point that is capacitively coupled to ground and being further resistively connected to the emitters of the respective ninth, tenth and eleventh transistors;

the first common input point being resistively connected to the collector of the second transistor;

twelfth, thirteenth and fourteenth, substantially identical npn transistors, with the base and collector of each of these transistors being connected and the collectors of the twelfth, thirteenth and fourteenth transistors being connected, respectively, to the emitters of the ninth, tenth and eleventh transistors;

fourth, fifth and sixth, substantially identical circuits, each comprising a resistor and a capacitor in parallel, connected at one circuit end, respectively, to the emitters of the twelfth, thirteenth and fourteenth transistors, with the other end of each circuit being connected to a third common point that is capacitively connected to ground and is resistively connected to a voltage source of 800 volts;

fifth and sixth, substantially identical transmission lines having associated resistances of substantially 50 ohms each, one end of each of these two transmission lines being resistively connected to ground and being capacitively connected to the second common input point; and the second ends of the third, fourth, fifth and sixth transmission lines being connected to said cathode of said first triode amplifier tube.

4. Apparatus according to claim 1, wherein said first voltage stepdown transformer comprises:

three substantially identical transmission lines, arranged in parallel with associated resistance of substantially 50 ohms each, with each transmission line being connected at one end across a common resistor to said cathode of said second triode amplifier tube.

5. Apparatus according to claim 1, wherein said second, third and fourth voltage step-down transformers each comprise:

first, second and third, substantially identical transmission lines, arranged in parallel with associated resistances of substantially 50 ohms each, all being connected across said common second capacitor to said anode of said second triode amplifier tube;

fourth, fifth, sixth and seventh, substantially identical transmission lines, arranged in parallel with associated resistances of substantially 50 ohms each, with these four transmission lines each being connected at one end to the second end of the first transmission line and each being connected at the other end to said cathode of said third triode amplifier tube;

eighth, ninth, tenth and eleventh, substantially identical transmission lines, arranged in parallel with associated resistance of substantially 50 ohms each, with these four transmission lines each being connected at one end of the second end of the second transmission line and each being connected at the other end to said cathode of said fourth triode amplifier tube; and twelfth, thirteenth, fourteenth and fifteenth substantially identical transmission lines, arranged in parallel with associated resistances of substantially 50 ohms each, with these four transmission lines each being connected at one end to the second end of the transmission line and each being connected to the other end to said cathode of said fifth triode amplifier tube.

* * * * *